United States Patent
Nakanishi et al.

(10) Patent No.: US 7,396,560 B2
(45) Date of Patent: Jul. 8, 2008

(54) METHOD FOR PREPARING ORGANIC-INORGANIC COMPOSITE MICROCRYSTAL

(75) Inventors: Hachiro Nakanishi, Sendai (JP); Hidetoshi Oikawa, Sendai (JP); Shuji Okada, Sendai (JP); Hitoshi Kasai, Sendai (JP)

(73) Assignee: Japan Science and Technology Agency, Saitama-ken (JP)

( * ) Notice: Subject to any disclaimer, the term of this patent is extended or adjusted under 35 U.S.C. 154(b) by 784 days.

(21) Appl. No.: 10/487,093

(22) PCT Filed: Mar. 18, 2002

(86) PCT No.: PCT/JP02/02555
§ 371 (c)(1),
(2), (4) Date: Feb. 19, 2004

(87) PCT Pub. No.: WO03/025664
PCT Pub. Date: Mar. 27, 2003

(65) Prior Publication Data
US 2004/0195709 A1    Oct. 7, 2004

(30) Foreign Application Priority Data
Sep. 11, 2001    (JP)    ............................... 2001-274462

(51) Int. Cl.
*B05D 7/00* (2006.01)
*C08F 2/46* (2006.01)
*C08J 7/18* (2006.01)

(52) U.S. Cl. ....................................... 427/212; 427/487

(58) Field of Classification Search ................. 427/212, 427/487
See application file for complete search history.

(56) References Cited

U.S. PATENT DOCUMENTS 4,828,758 A    5/1989    Gillberg-LaForce (Continued)

FOREIGN PATENT DOCUMENTS

JP    6-238161    8/1994

(Continued)

OTHER PUBLICATIONS

Katagi, et al., "Temperature and Crystal Size Dependence . . . ", Mol. Cryst. Liq. Cryst., 1998, vol. 314, pp. 285-290.

(Continued)

*Primary Examiner*—Elena Tsoy
(74) *Attorney, Agent, or Firm*—Hahn & Voight; Roger C. Hahn

(57) ABSTRACT

A method for preparation of inorganic fine particle-organic crystal hybrid fine particle comprising; pouring an organic material having π-conjugated bond as a water soluble solution into aqueous dispersion in which inorganic fine particles of 50 nm or less selected from the compound group consisting of metal fine particles, semi-conductor fine particles, fine particles of inorganic fluorescent material and fine particle of inorganic luminescent material, are dispersed, co-precipitating said inorganic fine particle which forms a core into said organic material which forms a shell in said dispersion and forming shell of fine crystal of said organic material on the surface of the core of said inorganic fine particles of 50 nm or less by controlling the size of said inorganic fine particle and by controlling the adding amount of said organic material.

9 Claims, 3 Drawing Sheets

U.S. PATENT DOCUMENTS 6,608,716 B1 * 8/2003 Armstrong et al. .......... 359/342

FOREIGN PATENT DOCUMENTS

JP 10-36517 2/1998

OTHER PUBLICATIONS

Masuhara, et al., "Metal-Polydiacetylene Hybridized Microcrystals . . . ", The Society of Polymer Science, 2001, vol. 50, No. 13, pp. 3362-3363.

Masuhara, et al., "Hybridized Microcrystals Composed of Metal . . . ", Dai 48 Kai Oyo Butsurigaku . . . , Mar. 28, 2001, Separate vol. 3, p. 1220.

Cassagneau, et al. "Layer-by-Layer Assembly of Thin Film Zener Diodes from Conducting . . . ", J. Am. Chem. Soc. 1998, 120, pp. 7848-7859.

Weller, H., "Self-Organized Superlattices of Nanoparticles", Angew. Chem. Int. Ed. Engl. 1996, 35, No. 10, pp. 1079-1081.

Katagi, et al., "Size Control of Polydiacetylene Microcrystals", Jpn. J. Appl. Phys. vol. 35, (1996) pp. L1364-L1366.

Kasai, et al., "A Novel Preparation Method of Organic Microcrystals", Jpn. J. Appl. Phys. vol. 31 (1992) pp. L1132-L1134.

Yase, et al., "Electron Spectroscopic Imaging of Organic Fine Crystals", Mol. Cryst. Liq. Cryst., 1997, vol. 294, pp. 71-74.

Katagi, et al., "Preparation and Characterization of Poly-Diacetylene Microcrystals", J.M.S.—Pure Appl. Chem., A34(10), pp. 2013-2024 (1997).

Harada, et al., "X-Ray Diffraction Study of Fine Gold Particles Prepared by Gas Evaporation . . . ", Surface Science 106 (1981) pp. 51-57.

Neeves, et al., "Composite structures for the enhancement of nonlinear-optical . . . ", J. Opt. Soc. Am. B, vol. 6, No. 4, pp. 787-796, Apr. 1989.

Haus, J. W., "Enhanced optical properties of metal-coated nanoparticles", J. Appl. Phys. 73(3), Feb. 1, 1993, pp. 1043-1048.

Olsen, et al., "Gold Cluster Laden Polydiacetylenes Novel Materials . . . ", J. Am. Chem. Soc. 1991, 113, pp. 7758-7760.

* cited by examiner

METHOD FOR PREPARING ORGANIC-INORGANIC COMPOSITE MICROCRYSTAL

FIELD OF THE INVENTION

The present invention basically relates to a method for preparation of inorganic fine particle-organic fine crystal hybrid fine particle comprising; pouring an organic material having π-conjugated bond which is dissolved in water soluble solvent into aqueous dispersion in which inorganic fine particles are dispersed as a solution state, and co-precipitating said inorganic fine particle which forms a core and said organic material which forms a shell in said dispersion, coating said inorganic fine particle with fine crystal shell of said organic material thinner than 50 nm by controlling the size of said inorganic fine particle and by controlling adding amount of said organic material.

BACK GROUND OF THE INVENTION

It is known that the fine crystal particles of metal or semi-conductor indicate an interesting optical characteristic, and that therefore many researches are carried out. For example, it is known that an inorganic fine crystal exhibits the enhancement of three-order non-linear optical characteristic. Further, the fine particles having size between single atom and/or molecule and these bulk particles are classified as the meso size, because of the meaning of intermediate size, and its specific characteristic based on the size was investigated, especially, from the view points of fundamental science and optical application, for example, from the view point of improvement of non-linear optical property caused by a quantum confinement effect are greatly investigated. [Reffer to T. Cassagneau, T. E. Mallouk and H. Fendler, J. Am. Chem. Soc. 120 (1998) 7848, H. Weller; Angew, Int. Ed. Engl. 35 (1996) 1079]

In the meanwhile, the inventors of the present invention have accomplished the re-precipitation method for the preparation of fine crystals of organic compound having π-conjugated bond and their paper was already reported. This method is very useful as the fine crystallization method for a thermally unstable organic compound, because the generation of fine crystals can be carried out under very mild condition. Further, according to this method, it is possible to adjust the size of the organic fine crystals in the range of crystal size from several ten nanometers to several hundred nanometers. [H. Katagi, H. Kasai, S. Okada, H. Oikawa, K. Komatsu, H. Matsuda, Z. Lui and H. Nakanishi: Jpn. J. Appl. Phys. 35 (1996)1364, H. Kasai, H. S. Nalwa, H. Oikawa, S. Okada, H. Matsuda, N. Minami, A. Kakuta, K. Ono, A. Mukoh and H. Nakanishi: Jpn. J.Appl. Phys. 32 (1992) 1132, K. Yase, T. Hanada, H. Kasai, T. Sato, S. Okada, H. Oikawa, H. Nakanishi: Mol. Cryst. & Liq. Cryst. 294 (1997) 71]. By this method, various kinds of fine crystals whose size are adjusted were prepared, and the relationship between crystal size and optical characteristic was studied. And from the results of the study, blue shift in optical absorption along with the reducing of the crystalline size was observed. [H. Kasai, H. Kamatani, S. Okada, H. Matsuda and H. Nakanishi, Jpn. J.Appl. Phys., 35. 1221 (1996)]. The interesting fact is that, in the range of one order bigger size than the size of fine crystal of metals and semi-conductors, the excitonic absorption peak position of organic fine crystal blue shifts with the reduction of the crystal size. This phenomenon can not be simply explained by the quantum size effect, and is speculated to be caused by a certain interaction between an exiton and a phonon in organic crystalline lattice which is thermally loosened. [J. Harada and K. Ohshima: Surf Sci.106 (1981) 51].

However, to the date, there was no paper reporting the study of organic-inorganic hybrid fine crystal. Only the improvement of characteristic of a non-linear optical material composed of organic material and metal fine particles (by surface plasmon) is theoretically predicted. [A. E. Neeves and M. H. Birnboin: J. Opt. Soc. Am. B6 (1989) 787, J. W. Haus, H. S. Zhau, S. Takami, M. Harasawa, I. Homma and H. Komiya: J.Appl. Phys. 73 (1993) 1043, JP2-8822A publication, JP8-95099A publication]. In connection with the above, although the spectrum of ground state was not made clear, the improvement of non-linear optical characteristic in an amorphous polydiacetylene (PDA) thin film in which gold fine particles were dispersed was reported. [A. W. Olsen and Z. H. Kafafi: J. Am. Chem. Soc. 113 (1991) 7758]. Even if in the case of polydiacetylene which is concerned as one of the most promising material to realize an ultra high speed optical switching device, the enhancement of non-linear optical characteristic by more than one order is required, therefore, the fabrication of the hybrid fine crystal which was predicted by the above mentioned theory is the most important subject from the view point of the application.

In connection with these backgrounds, the subject of the present invention is to provide a method for preparation of organic-inorganic hybrid fine crystal. Further the subject of the present invention is to obtain organic-inorganic hybrid fine crystals having various sizes and forms based on the method, to obtain the data which relate to these various characteristics e.g., optical characteristic, and to provide a basic information of a novel device based on these data. Since said hybrid material is prepared as a hybrid material hybridized with organic fine crystal, it is obvious that the above mentioned method for organic fine crystal under mild condition is effective. Therefore, the inventors of the present invention started to investigate a new method for preparation of a hybrid material with inorganic fine particles using the above mentioned method. In the above mentioned re-precipitation method of organic fine crystal, the inventors of the present invention have found that the hybrid fine crystal characterized having an inorganic particle as a core and a fine crystal shell of the organic material surrounding the surface of the core can be formed by following method and dissolved the subject of the present invention. That is, the dispersion in which inorganic fine particles are dispersed is used as the poor solvent by adding compatible solvent with said poor solvent e.g. water, for example, acetone in which the material to form the organic fine crystal is dissolved.

DISCLOSURE OF THE INVENTION

The present invention is a method for preparation of inorganic fine particle-organic crystal hybrid fine particle comprising; pouring an organic material having π-conjugated bond as a water soluble solution into aqueous dispersion in which inorganic fine particles of 50 nm or less selected from the compound group consisting of metal fine particles, semiconductor fine particles, fine particles of inorganic fluorescent material and fine particles of inorganic luminescent material are dispersed, co-precipitating said inorganic fine particle which forms a core into said organic material which forms a shell in said dispersion and coating said inorganic fine particle with fine crystal shell of said organic material of thinner than 50 nm by controlling the size of said inorganic fine particle and by controlling the adding amount of said organic material. Desirably, the present invention is the method for preparation of said inorganic fine particle-organic crystal hybrid fine particle, wherein the dispersion of metal fine particle used for the preparation of inorganic fine particle-organic crystal hybrid fine particle by the co-precipitation method is the dispersion in which meso size metal fine particles of 50 nm or less which can be obtained by reducing metal salt solution, more desirably is the method for preparation of said inorganic fine particle-organic crystal hybrid fine particle, wherein the inorganic particle is gold or silver, further desirably is the method for preparation of said inorganic fine particle-organic crystal hybrid fine particle, wherein the organic material having π-conjugated bond which forms the shell of organic fine crystal is diacetylene. Furthermore desirably, the present invention is the method for preparation of hybrid fine particle having a shell of π-conjugated polymer organic fine crystal of the same form as the monomer on the surface of an inorganic fine particle comprising, transforming the shell of the organic fine crystal of said inorganic fine particle-organic fine crystal hybrid fine particle to π-conjugated polymer organic fine crystal having the same form as the monomer by solid-state polymerization.

BRIEF ILLUSTRATION OF THE DRAWINGS

FIG. 1 is the example showing the preparation process of the inorganic fine particle-organic crystal hybrid fine particle of the present invention. Silver fine particles Ag are dispersed, diacetylene DCHD is poured into the dispersion with constant stirring by a stirrer S to generate silver fine particle-diacetylene fine particles Ag-DCHD H.NP by co-precipitation C.R. By standing S.D, silver fine particle-diacetylene fine crystals Ag-DCHD H.NC are deposited. Silver fine particle-polydiacetylene hybrid fine crystal Ag-pDCHD H.NC, which is the aimed product, can be obtained by solid-state polymerization S.S.P of diacetylene by ultraviolet irradiation UV.R.

FIG. 2 is the scheme for the generation of the inorganic fine particle-organic crystal hybrid fine particle of the present invention. Process 1 shows the state that diacetylene monomer droplet DCHD indicated by a large round mark O is added in NP aqueous dispersion of silver fine particles Ag indicated by a small round mark O. And in process 2, during standing S.D for 20 minutes, the fine particle Ag-DCHD-H.NC characterizing diacetylene monomer fine particle is formed on the surface of Ag fine particle. In the process 3, when diacetylene is irradiated with UV light, solid-state polymerization S.S.P of the diacetylene monomer fine crystal occurs, and silver fine particle-polydiacetylene hybrid fine particle Ag-PDCHD-H.NC can be obtained.

DESCRIPTION OF THE PREFERRED EMBODIMENT

The present invention will be illustrated more in detail by following description.

A. The important point of this invention is illustrated by referring to the figures.

Figure 1:
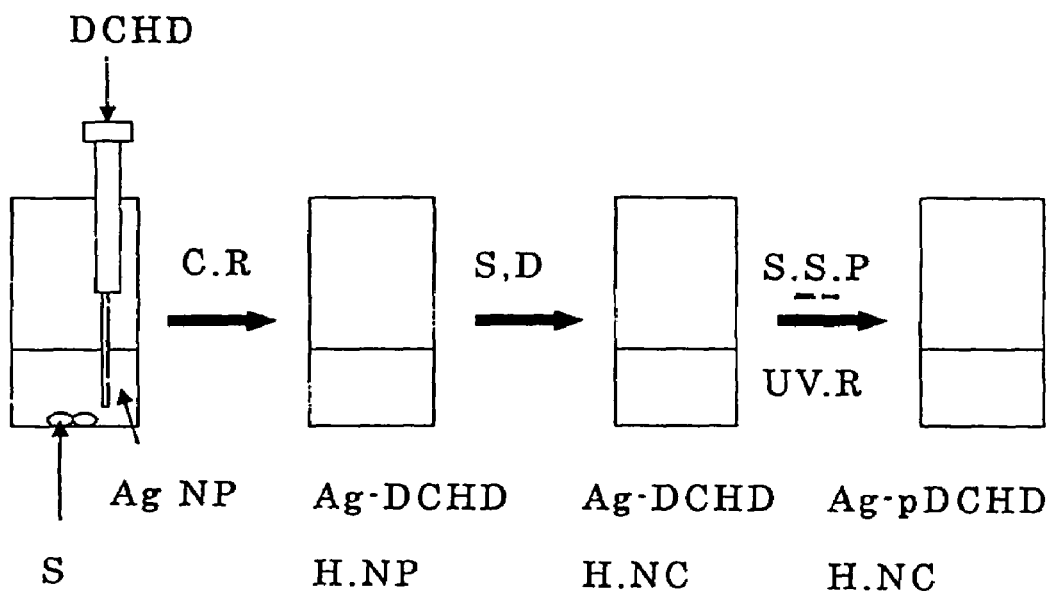

FIG. 1 illustrates the outline of the preparation process of the inorganic fine particle-organic crystal hybrid fine particle of the present invention.

In this drawing, the process is illustrated by the example using aqueous dispersion of silver fine particles and adding diacetylene (DCHD) solution. However, other fine particles of metal, such as Au, Pt, Pd, Rh, Cu, Ni, Co or Al can be used instead of Ag fine particles, and CdS, CdSe, ZnS, ZnSe or InAs can be also used as the fine particles of semi conductor.

As diacetylene, for example, 1,6-di(N-carbasolyl)-2,4-hexadiin (DCHD), which is the compound of chemical formula 1 is used. As the other compounds to be used instead of DCHD, any compounds which can maintain the form of monomer and the optical characteristic after solid-state polymerization are available such as compounds of, for example, 5,7-dodecadiin -1,12-diilbis(N-(butoxycarbonyilmethyl)carbamate (4BCMU), 2,4-hexadiin-1,6-diildi(p-toluenesulfonate) (PTS).

Chemical formula 1

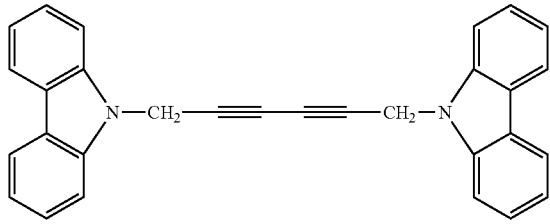

In the method for preparation of the inorganic fine particle-organic crystal hybrid fine particle shown in FIG. 1, the first process in the operation is to pour acetone solution of DCHD into aqueous dispersion of Ag fine particles which is stirred strongly. The second process is the operation to generate Ag-DCHD fine particles by co-precipitation. The third process is the operation to generate hybrid crystal particles of Ag-DCHD fine crystal, Ag-DCHD-H.NC. The fourth process is the operation to generate Ag-poly (DCHD) hybrid fine crystal, Ag-pDCHD-H.NC, by solid-state polymerization of DCHD caused by the irradiation of UV light to the hybrid particles of Ag-DCHD fine crystal generated in the previous process.

Figure 2:
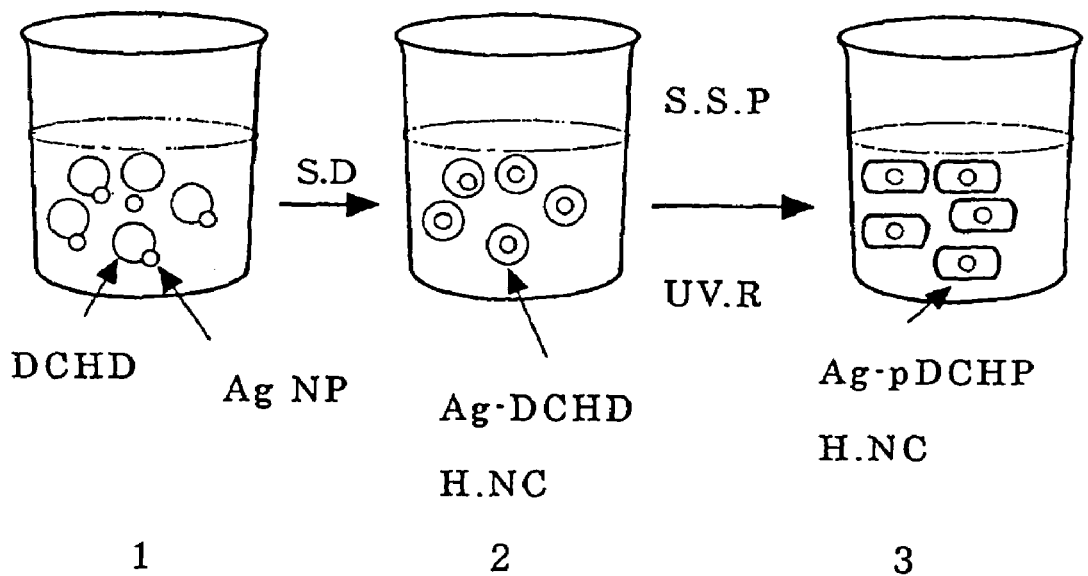

FIG. 2 is the schematic model of the process of FIG. 1 which shows the generation of the inorganic fine particle-organic crystal hybrid fine particle of the present invention. The process 1 shows the existing forms of Ag fine particles Ag NP and DCHD droplet which is poured in dispersion in the first and the second processes of FIG. 1.

B. Fine particle of metal which is the fine particle forming a core of the hybrid fine particle, such as silver, is prepared by reducing silver nitrate using sodium borohydride.

Other metal fine particle can be obtained by reducing metal acid or the salt such as halogenated auric acid or halogenated rhodium. Further, dispersion of fine particles of semi conductor material can be obtained by carrying out the synthesis of the semi conductor compound in dispersion medium under the presence of a doping agent.

Among the inorganic fine particles, the homogeneous, spherical and almost mono-dispersed fine particle is suitable for the improvement of the function of hybrid fine particles.

As the organic material which forms an organic fine crystal layer by co-precipitation method, diacetylene which has non linear optical characteristic can be mentioned as the typical example. And as the compound which forms polymer single crystal by solid-state polymerization, said compound or the compounds described in Japanese Patent Laid Open Publications 62-25547, 2000-95762 or 8-95099 (refer to pages 4 and 5) can be mentioned. As the other monomer, 5,7-dodecadiin-1, 12-diilbis(N-(butoxycarbonylmethyl)carbamate) (4BCMU), or 2,4-hexadiin-1,6-diildi(p-toluenesulfonate) (PTS) can be mentioned.

D. The required condition to realize the co-precipitation for the solvent of these monomers is to dissolve said monomers, to have compatibility with the solvent in which inorganic fine particles are dispersed and to have the characteristic to reduce the solubility of monomer so as to co-precipitate organic fine particles by making compatible said solvent with the dispersing solvent.

E. As the means for solid-state polymerization, UV light, gamma-ray and electron beam can be used.

EXAMPLES

The present invention will be illustrated specifically according to the following Examples, however, is intending to make clear the usefulness of the present invention and is not intending to limit the scope of the present invention.

Example 1

1. 3.5 mg of sodium borohydride $NaBH_4$ was dissolved into 60 mL of ultrapure water and this aqueous solution was cooled approximately up to 4° C. Then, 20 mL of $AgNO_3$ aqueous solution ($2.2 \times 10^{-3}$M) which was previously maintained at the temperature of 12° C. was dropped into said $NaBH_4$ solution and the dispersion of Ag fine particles was prepared. The wave length absorption peak of the obtained dispersion was 395 nm and the diameter of Ag fine particle was approximately 15 nm by the measurement using SEM.

2. 200 μL (7.5 mM) of diluted acetone solution of DCHD monomer was poured into the aqueous dispersion (10 mL) of Ag fine particles by stirring strongly.

3. After maintained for 20 minutes, UV light was irradiated to the dispersion for 20minutes, then DCHD monomer crystal domain was converted to poly (DCHD) fine crystal domain by solid-state polymerization process. As the UV light source, 20 W UV light source (EF-160C/J, SPECTOOLINE Co., $\lambda=254$ nm) was used. The size, form and morphology of poly (DCHD) fine crystal, Ag fine crystal and hybrid fine crystal were evaluated by dynamic light scattering (DLS: DLS-700, Otsuka Electronics Co.,), scanning electronic microscope (SEM: S-900, Hitachi Ltd.) and transmission electronic microscope (TEM: JEM-2010, JEOL Ltd.).

For the measurement of visible-UV spectrum of the dispersion of poly (DCHD) fine crystals, metal fine particles and hybrid fine particles, UV-VIS spectrum meter (V-570DS, JASCO Ltd.) was used. By the SEM observation of the obtained hybrid fine crystal, two different types of fine crystal whose size and form are different were observed. One was the larger size crystal of approximately 180 nm being a specific rectangular poly (DCHD) fine crystal in which spherical Ag fine particle was embedded. While, many hybrid fine crystal were spherical crystal whose size was approximately 25 nm and was similar to the Ag fine particle.

However, it became clear that the all particles whose size is approximately 25 nm were larger than the Ag fine particle. Accordingly, it is obvious that the Ag fine particle is covered with domain of poly (DCHD) fine crystal. In other word, the structure is characterized as the Ag fine particle is embedded in the domain of poly (DCHD) fine crystal.

For the purpose to make clear this form, the observation using a transmission electronic microscope TEM was carried out. Several tiny black points were observed, and these black points were confirmed to be Ag fine particle and poly (DCHD) fine crystal layer surrounding said Ag fine particle were observed.

The color of the hybrid dispersion consisting of DCHD fine crystals and Ag fine particles was yellow and this color was changed to bluish violet by UV light irradiation for 20 minutes.

Figure 3:
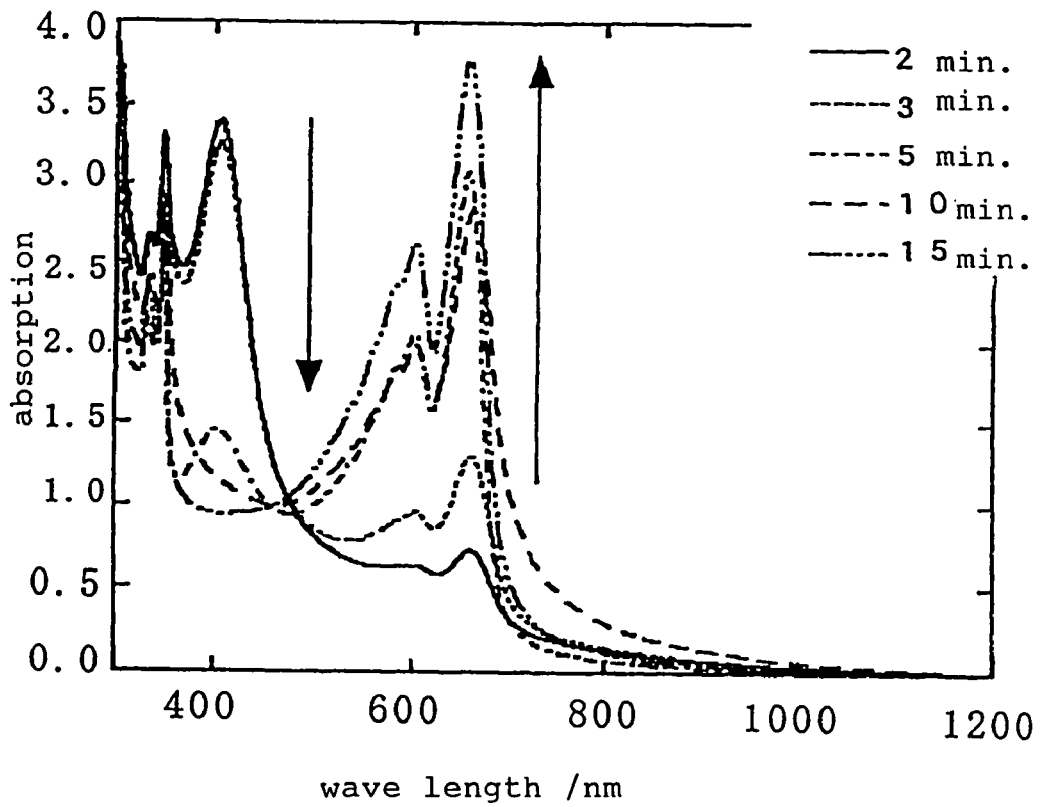
FIG. 3 shows the relationship between irradiation time of the inorganic fine particle-organic crystal hybrid fine particle to ultraviolet light and changes of visible absorption spectra, and the change of optical characteristic at the above mentioned hybridization.

FIG. 3 shows the relationship between irradiation time of ultraviolet light to the inorganic fine particle-organic crystal hybrid fine particle and change of visible absorption spectrum. The absorption peak at 655 nm is caused by absorption spectrum of the exciton absorption of π-conjugated main chain and the absorbance increases with the time of irradiation of UV light.

The electronic interaction in hybrid fine crystal appears in red shift of the exciton absorption peak of poly (DCHD). As previously reported, the exciton absorption peak position is dependent on crystal size, and blue shifts along with the reduction of size of the crystal.

Figure 4:
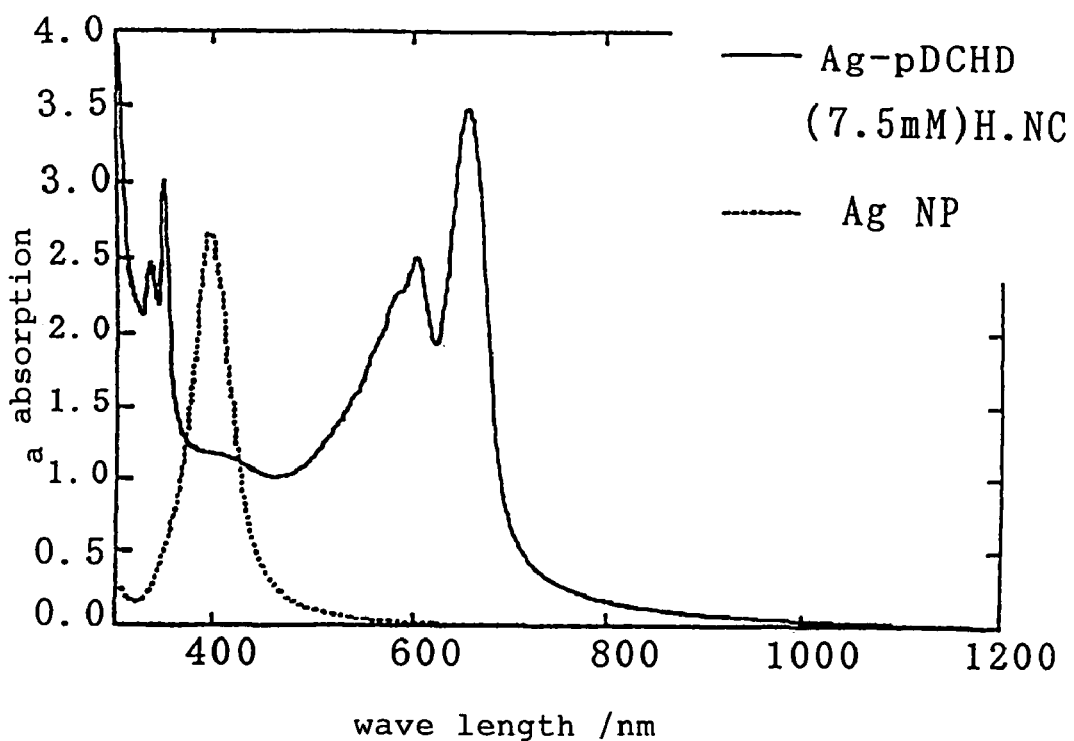
FIG. 4 shows the change of the absorption spectrum of silver fine particles Ag NP and silver fine particles-poly (DCHD) fine crystal hybrid fine particles.
Figure 5:
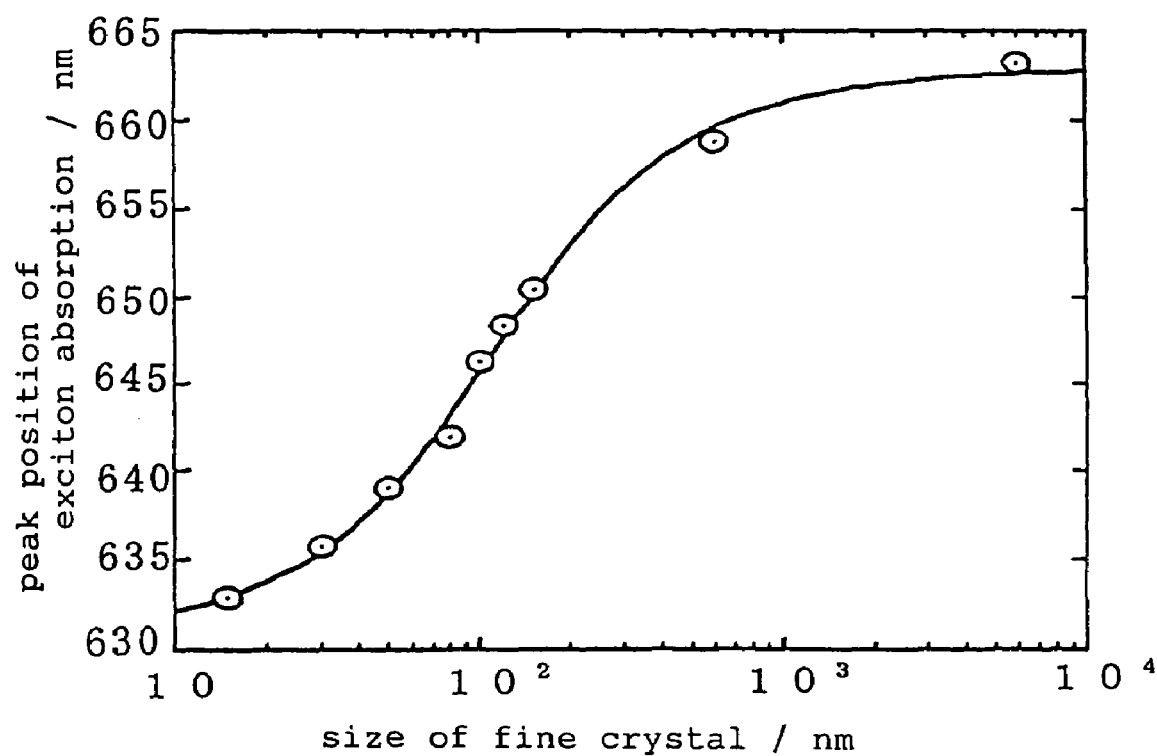
FIG. 5 shows the correlation between poly (DCHD) fine crystal size and the peak position of exciton absorption spectrum.

Therefore, as shown in FIG. 4 and FIG. 5, in the case of only poly (DCHD) fine crystal with 25 nanometer size, the absorption peak locates around at 637 nm. However, although the size of the hybrid fine crystal is the same as that of the poly (DCHD) fine crystal, the position of exciton absorption peak of the hybrid fine crystal is actually 655 nm.

Consequently, the red shift of exciton absorption is related closely with the disappearance of plasmon absorption of Ag fine particles. The inventors of the present invention succeeded the preparation of hybrid fine particles composed of poly (DCHD) fine crystal (shell layer) and Ag fine particles domain (core part) and can present clearly the possibility of the electronic interaction between said two domains.

The generation of this interaction can be speculated as follows from the phenomenological view point.

1. The energy level of plasmon is not so largely different from the energy level of exciton.
2. Surface contact of organic compound with metal is complete in the limited nano space.
3. The volume ratio between organic compound and metal is most suitable in the hybrid fine crystal.

Especially, items 2 and 3 are very important. Both or either of organic compound or metal in bulk state are meaningless, and it is necessary to be contacted each other in limited nano space.

INDUSTRIAL APPLICABILITY

As the mentioned above, the method for preparation of the inorganic fine particle-organic crystal hybrid fine particle of the present invention by controlling form or size can improve not only the characteristics of the conventional fine particle by said form and/or size but also excellent effect to provide the possibility of new functional materials.

The invention claimed is:

1. A method for preparation of fine particles of an inorganic fine particle-organic crystal hybrid comprising:
    pouring an organic material having π-conjugated bond which is dissolved in a water soluble solvent into aqueous dispersion in which inorganic fine particles of 50 nm or less selected from the group consisting of metal fine particles, semi-conductor fine particles, fine particles of inorganic fluorescent material and fine particles of inorganic luminescent material, are dispersed, precipitating said organic material in the form of fine crystal onto said inorganic fine particles thereby producing coated fine particles having core-shell structure and forming the shell of fine crystal of said organic material on the surface of the core of said inorganic fine particles of 50 nm or less by controlling the size of said inorganic fine particles and by controlling the adding amount of said organic material.

2. The method for preparation of the fine particles of the inorganic fine particle-organic crystal hybrid of claim 1, wherein the organic material having π-conjugated bond which forms the shell of organic fine crystal is diacetylene.

3. The method for preparation of fine particles of claim 2 further comprising the step of, converting the shell of the organic fine crystal of said inorganic fine particle-organic fine crystal hybrid to π-conjugated polymer organic fine crystal by solid-state polymerization wherein said fine particles have a shell of π-conjugated polymer fine crystal on the surface of the inorganic fine particles.

4. The method for preparation of the fine particles of the inorganic fine particle-organic crystal hybrid of claim 1, wherein the dispersion of metal fine particles used for the preparation of inorganic fine particle-organic crystal hybrid fine particles by the co-precipitation method is the dispersion in which meso size metal fine particles of 50 nm or less can be obtained by reducing metal salt solution.

5. The method for preparation of the fine particles of the inorganic fine particle-organic crystal hybrid of claim 4, wherein the organic material having π-conjugated bond which forms the shell of organic fine crystal is diacetylene.

6. The method for preparation of fine particles of claim 5 further comprising the step of, converting the shell of the organic fine crystal of said inorganic fine particle-organic fine crystal hybrid to π-conjugated polymer organic fine crystal by solid-state polymerization whereby said fine particles have a shell of π-conjugated polymer fine crystal on the surface of the inorganic fine particles.

7. The method for preparation of the fine particles of the inorganic fine particle-organic crystal hybrid of claim 4, wherein the inorganic fine particles are gold or silver.

8. The method for preparation of the fine particles of the inorganic fine particle-organic crystal hybrid of claim 7, wherein the organic material having π-conjugated bond which forms the shell of organic fine crystal is diacetylene.

9. The method for preparation of fine particles of claim 8 further comprising the step of, converting the shell of the organic fine crystal of said inorganic fine particle-organic fine crystal hybrid to π-conjugated polymer organic fine crystal by solid-state polymerization whereby said fine particles have a shell of π-conjugated polymer fine crystal on the surface of the inorganic fine particles.

* * * * *